United States Patent [19]

Waggoner

[11] Patent Number: 5,420,447
[45] Date of Patent: May 30, 1995

[54] DOUBLE BUFFER BASE GATE ARRAY CELL

[75] Inventor: Charles D. Waggoner, Richardson, Tex.

[73] Assignee: SGS-Thomson Microelectronics, Inc., Carrollton, Tex.

[21] Appl. No.: 11,390

[22] Filed: Jan. 29, 1993

[51] Int. Cl.$^6$ .......................................... H01L 27/10
[52] U.S. Cl. ................... 257/206; 257/202; 257/204; 257/208; 257/211
[58] Field of Search ............... 257/202, 204, 206, 208, 257/211

[56] References Cited

U.S. PATENT DOCUMENTS

| | | | |
|---|---|---|---|
| 4,884,115 | 11/1989 | Michel et al. | 257/204 |
| 5,187,556 | 2/1993 | Nariishi et al. | 257/206 |

FOREIGN PATENT DOCUMENTS

| | | | |
|---|---|---|---|
| 0080361 | 11/1982 | European Pat. Off. | 257/206 |
| 60-80251 | 5/1985 | Japan | 257/206 |
| 61-064337 | 5/1986 | Japan | 257/206 |

OTHER PUBLICATIONS

Semiconductor Devices–Physics and Technology, S. M. Sze, 1985, p. 362.
Hashimoto, et al., "New Base Cell for High Density Gate Array," *Custom Integrated Circuits Conference* (IEEE, 1992) pp. 27.2.1–27.2.4.
Weir, et al., "A 250K–Circuit ASIC Family Using a DRAM Technology", *IEEE 1990 Custom Integrated Circuits Conference*, (IEEE, 1990) pp. 4.6.1–4.6.5.
*Patent Abstracts of Japan*, vol. 12, No. 287, (1988).
*Patent Abstracts of Japan*, vol. 9, No. 219, (1985).

*Primary Examiner*—Steven Ho Yin Loke
*Attorney, Agent, or Firm*—Rodney M. Anderson; Lisa K. Jorgenson; Richard K. Robinson

[57] ABSTRACT

A base cell for a CMOS gate array is disclosed, which utilizes cutoff transistor isolation. The disclosed cell implements the cutoff transistor isolation by way of separate outer electrodes for the p-channel and n-channel sides, so that p-type and n-type diffused regions are disposed at the edges of the cell to be shared with adjacent cells. The disclosed cell further includes a pair of inner electrodes which extend over both the n-type and p-type active regions. This construction enables the use of cutoff isolation techniques, but also provides the ability to implement transmission gate style latches via the common complementary gate inner electrodes. Greater efficiency of silicon area, improved utilization, and reduced input loading and active power dissipation result from an integrated circuit incorporate the disclosed cells.

18 Claims, 7 Drawing Sheets

DOUBLE BUFFER BASE GATE ARRAY CELL

BACKGROUND OF THE INVENTION

In the field of electronic systems, the use of gate arrays to implement digital functions has become widespread in recent years. As is well known in the art, a gate array is an integrated circuit fabricated as a regular arrangement of transistors, which can be interconnected according to the desired digital function. The transistors are conventionally grouped into "base cells", rather than as individual transistors, with each base cell comprising a sufficient number of transistors to implement an elemental logic function (i.e., a "gate"). A base cell (often also referred to as a "basic cell", "basic block", or "functional block") corresponds to a step-and-repeat silicon structure, from which a circuit function is realized by the routing of overlying metal or other conductive elements.

The use of gate arrays allows for the rapid production of customized digital circuits. This results from the fabrication of integrated circuit wafers with the transistors in the base cells defined by lower level physical elements, but with the actual digital circuit function not defined until later stages in the manufacturing process. In the case of MOS gate arrays, the base cell transistors are defined by source and drain diffusions and first level polysilicon gate electrodes. Upper level metal interconnections are then defined to interconnect the transistor elements according to the desired circuit function. This process allows the customized arrangement of the gates, or cells, to be implemented at the latest stages in the manufacturing process, reducing the design-to-manufacture time of the digital circuit. Custom integrated circuits may thus be produced at very short cycle times, and with a minimum number of custom photomasks.

The cost of gate array implementations, as is the case with other integrated circuits, depends upon the amount of semiconductor area used to implement the function, and also upon the complexity of the manufacturing process. Accordingly, the ability to utilize a high percentage of the base cells in a circuit results in a low cost implementation of the function, as high utilization enables the realization of a complex digital function in relatively little semiconductor area. Multiple levels of interconnection may be used to increase the cell utilization by allowing metal conductors to cross-over one another, but the manufacturing cost increases dramatically as additional interconnection layers are introduced. The gate array designer is therefore often faced with a tradeoff between the utilization rate of the available cells and the number of interconnection levels to be used.

Another concern for the gate array designer is to provide isolation between cells or transistors within the gate array, as such isolation is of course necessary to ensure proper circuit function. As in the case with any integrated circuit of the MOS type, isolation may be implemented by transistors biased into an off condition, by physical barriers such as oxide structures, or by a combination of the two (the well-known field oxide transistors). Selection of the isolation technique and its interaction with the elements of the base cell are significant factors that affect the efficiency of the gate array. Other design rules, such as the minimum channel length and width of the transistors to provide the specified drive capability in combination with the process technology used, and such as the spacing requirements between elements of the same or different levels, must also be considered in the design of the gate array base cell.

Referring now to FIGS. 1a and 1b, a first conventional gate array base cell will be described for purposes of background. Cell 2 of FIGS. 1a and 1b is implemented according to the cutoff transistor isolation type, as will be apparent from the description below, and according to complementary metal-oxide-semiconductor (CMOS) technology. Conventional cell 2 in this example includes a p-channel transistor and an n-channel transistor, and as such the elemental gate implemented by cell 2 is a CMOS inverter.

Referring to FIG. 1a, each cell 2 includes polysilicon electrode 10 and polysilicon electrode 12, each of which have enlarged pad regions at their terminal ends which overlie field oxide 4. The p-channel transistor in cell 2 is implemented by polysilicon electrode 10 which is disposed between (and overlies) p-type diffused regions 6 in the conventional manner for PMOS transistors, such that the p-type diffused region 6 on either side of electrode 10 serve as the source and drain regions for the p-channel transistor with electrode 10 serving as the gate for the transistor. Similarly, electrode 12 in cell 2 is disposed between and above n-type diffused regions 8, so that n-type diffused regions 8 may serve as source and drain, and electrode 12 as the gate, of an NMOS transistor. It is preferred that p-type diffused regions 6 and n-type diffused regions 8 are formed as diffusions performed after electrodes 10, 12 are in place, so that the transistors defined thereby are according to the well-known self-aligned configuration. Depending upon the particular conventional process used for fabrication, one or both of p-type diffused regions 6 or n-type diffused regions 8 may be formed in a well; in this example, p-type diffused regions 6 are formed in an n-type well, the boundary of which is illustrated in FIG. 1 by boundary WB. P-type diffused regions 6 are separated from n-type diffused regions 8 by field oxide 4 therebetween.

Disposed outside of field oxide 4 at the top and bottom of cell 2 (in the view of FIG. 1a) are diffused regions 7n and 7p, respectively. N-type diffused region 7n is formed in the n-well within which p-type diffused regions 6 are formed, and as such provides a location at which the bias of the n-well may be fixed (e.g., to $V_{dd}$); similarly, p-type diffused region 7p is formed into the p-type material within which n-type diffused regions 8 are formed, and thus provides a location for back-biasing the NMOS transistors in cells 2. In this conventional configuration, the row of cells above cells 2 of FIG. 1a have their PMOS transistors on the bottom, so that the diffused region 7n is shared between immediately adjacent cells 2 in the vertical direction of FIG. 1a. Similar reversal of the NMOS and PMOS transistors in the row of cells below cells 2 of FIG. 1a allow for sharing of p-type diffused region 7p therebetween.

The isolation technique used in the conventional example of FIGS. 1a and 1b is the cutoff transistor type, in which an adjacent transistor to that for which the function is desired is forced into its "off" state, preventing conduction from the transistors used to perform the digital logic function. Referring to FIG. 1b, cell 2 is illustrated after formation of overlying metallization used to implement the cutoff isolation; of course, other metallization (not shown in FIG. 1b) will also be used to implement the desired function of cell 2. In FIG. 1b, metal line 14 is connected to a $V_{dd}$ power supply, and is connected by way of silicon contacts both to p-type diffused region 6' and to electrode 10'. As such, the transistor defined by electrode 10' is necessarily held in the "off" state, given that all voltages in the circuit are between ground and $V_{dd}$. Accordingly, p-type diffused region 6" in cell 2 is isolated from p-type diffused region 6', such that p-type diffused region 6" may be driven to any voltage between $V_{dd}$ and ground without significant leakage to p-type diffused region 6'.

An alternative connection is illustrated relative to the n-channel transistor in FIG. 1b, as metal line 16 is connected to ground and by way of contact vias to n-type diffused region 8'; electrode 12' does not receive the ground bias in this case. As a result of metal lines 16, the transistor defined by electrode 12' may operate in combination with the n-channel transistor defined in cell 2, with a source region biased to ground.

The geometry of cell 2 in the example of FIGS. 1a and 1b is selected to provide the desired transistor drive characteristics and to accommodate a desired number of interconnection "tracks" in which metallization lines may be placed. Considering the difference in carrier mobilities, in this example the p-channel transistor width (i.e., the length of electrodes 10) is wider than that of the n-channel transistors (i.e., the length of electrodes 12). In this example, cell 2 provides eighteen metallization tracks running horizontally, with one horizonal track across each of the four rows of pads connected to electrodes 10 and 12, five tracks across the n-channel transistor area (electrodes 12), seven tracks across the p-channel transistor area (electrodes 10), one track over field oxide 4 between electrodes 10 and 12 (i.e., overlying well boundary WB in FIG. 1a), and one track for power distribution extending between rows of cells 2.

The number of interconnection tracks is selected based on the necessary number of tracks for implementation of conventional building-block gates, such as NAND, NOR, and D-type flip-flops (DFFs), that are expected to be used in most digital circuits to be implemented by the gate array with a given utilization factor and process complexity. For example, cells 2 of FIGS. 1a and 1b with eighteen tracks will yield approximately 75 to 80 percent usability (i.e., the percent of transistors to which connection may be made) if triple-level metallization is used. However, if the number of tracks is reduced to save silicon area, cross-connections or jumpers in one of the metal levels may be required, which will in turn reduce usability.

The example of FIGS. 1a and 1b is a conventional result for a cutoff isolation gate array, based on the above-noted tradeoffs. The power dissipated by the transistors is relatively high, however, given the large channel width necessary to accommodate the metallization tracks; for example, the size of cell 2 is 45 microns by 2.5 microns when using a modern fabrication process. In addition, the arrangement of cells 2 according to adjacent p-type and n-type transistors requires several cells to implement a digital function. For example, a two-input NAND function requires three cells 2 (or six transistors) for its implementation, considering the necessary isolation transistors. Accordingly, the cell arrangement of FIGS. 1a and 1b is quite efficient for circuits which utilize stacked inverters, as electrodes 10, 12 are easily connected to one another over field oxide 4 therebetween, but is relatively inefficient for certain realizations, such as transmission gate latches.

Referring now to FIG. 2, another conventional base cell arrangement utilizing oxide isolation is illustrated, and will now be described for purposes of background. Cells 20 of FIG. 2 are constructed according to CMOS technology, and as such include p-type diffused regions 26a through 26c and n-type diffused regions 28a through 28c. Each cell 20 in this example includes two electrodes 22a, 22b which extend over both the p-type transistor region and also the n-type transistor region; electrode 22a separates diffused regions 26a, 28a from diffused regions 26b, 28b, respectively, and electrode 22b separates diffused regions 26b, 28b from diffused regions 26c, 28c, respectively. According to this embodiment, therefore, p-channel and n-channel gates are connected together in each cell 20, with each cell 20 including two such gates. Electrodes 22a, 22b each have three flags or pads for connection, one at each end overlying field oxide 24, and one overlying field oxide 24 disposed between p-type diffused regions 26a, 26b, 26c and respective n-type diffused regions 28a, 28b, 28c. Diffused regions 23 are located at each end of cells 20, with n-type diffused region 23n within the n-well containing p-type diffused regions 26, and with p-type diffused region 23p within the p-well containing n-type diffused regions 28. Overlying metal power and ground bus lines (not shown) make contact to the wells by way of diffused regions 23, and thus provide substrate bias to the transistors in cell 20.

Neighboring cells 20 are isolated from one another, in the example of FIG. 2, by field oxide 24 disposed therebetween. In this example, p-type diffused region 26c is isolated from p-type diffused region 26a in the adjacent cell 20 by field oxide 24 of width $d_f$; similarly, n-type diffused region 28c is isolated from n-type diffused region 28a in the adjacent cell 20 by field oxide 24 of width $d_f$. Accordingly, each cell 20 is electrically isolated from adjacent cells by field oxide, unless interconnection by way of overlying metallization (not shown) makes the desired connection.

Cells 20 of FIG. 2 in this example include both vertical and horizontal interconnection tracks (relative to FIG. 2). For each cell 20, four vertical tracks run over the three flags or pads of electrodes 22a, 22b. Ten horizontal tracks may be implemented in cells 20, with three tracks across each of the p-type diffused regions 26 and n-type diffused regions 28, one track across each of the three flags of electrodes 22a, 22b. The tenth horizontal wiring track is between cells, with half of a track over each of diffused regions 23 illustrated in FIG. 2. Adjacent cells 20 in the vertical direction to those shown in FIG. 2 will have their n-type transistors below their p-type transistors (i.e., reversed in the vertical direction from those shown in FIG. 2), so that the cell immediately below cell 20 in FIG. 2 will have its diffused region 23p at its top, shared with diffused region 23p of cell 20.

As in the case of cells 2 of FIGS. 1a and 1b, the number of tracks selected in each direction are according to the number of necessary tracks for typical gates useful in digital circuits, such as NANDs, NORs, and D-type flip-flops (DEFs). Each cell 20 according to this embodiment of the invention, while including only four transistors, is sufficient to realize a two-input NAND function, since no transistors are required for isolation between cells 20. The oxide isolation structure of cells 20 of FIG. 2 has been observed to be very efficient in realizing transmission gate latches, but very inefficient in implementation of stacked inverter type latches and similar circuits.

Comparison of the base cell architectures of FIGS. 1a and 1b, on the one hand, and FIG. 2, on the other hand, will show that each has significant advantages and disadvantages relative to the other. The relative efficiencies of implementation of stacked inverter latches and transmission gate latches have been noted above. In addition, the cutoff isolation arrangement of FIGS. 1a, 1b allows for close implementation of cells, as no oxide is necessary; the oxide isolation arrangement of FIG. 2 reduces the necessary transistor width from that of the cutoff isolation cell, and thus reduces the power dissipation of the circuit.

It is an object of the present invention, however, to provide a base cell architecture in which transistors with minimum channel width may be used in combination with cutoff isolation.

It is a further object of the present invention to provide such an architecture in which additional transistors may be utilized in lieu of cutoff isolation for complex multiple-cell gate elements.

It is a further object of the present invention to provide such an architecture in which the silicon area required for isolation is minimized.

It is a further object of the present invention to provide such an architecture that is efficient for both stacked inverter and transmission gate style latch realization.

Other objects and advantages of the present invention will be apparent to those of ordinary skill in the art having reference to the following specification together with the drawings.

SUMMARY OF THE INVENTION

The present invention may be incorporated into a base cell layout, for example according to CMOS technology, in which four potential transistors per conductivity type are made available by way of four electrodes over each active region. In the case of a CMOS implementation, the outer electrodes of the four are each separated from their complementary counterparts, such that the outer n-channel gate electrodes are not connected to the outer p-channel gate electrodes. Each of the inner electrodes extend across both the p-type and n-type active regions, and have enlarged flags or pads for interconnection which are located at a different vertical location than those of the outer electrode pairs. The outer electrode pairs allow for the active regions of the cell to be in contact with active regions of neighboring cells, avoiding the necessity of oxide isolation.

BRIEF DESCRIPTION OF THE DRAWINGS

FIG. 4b is an electrical diagram, in schematic form, of the circuit realized in FIG. 4a.

FIG. 5b is an electrical diagram, in schematic form, of the circuit realized in FIG. 5a.

DETAILED DESCRIPTION OF THE PREFERRED EMBODIMENT

Figure 3:
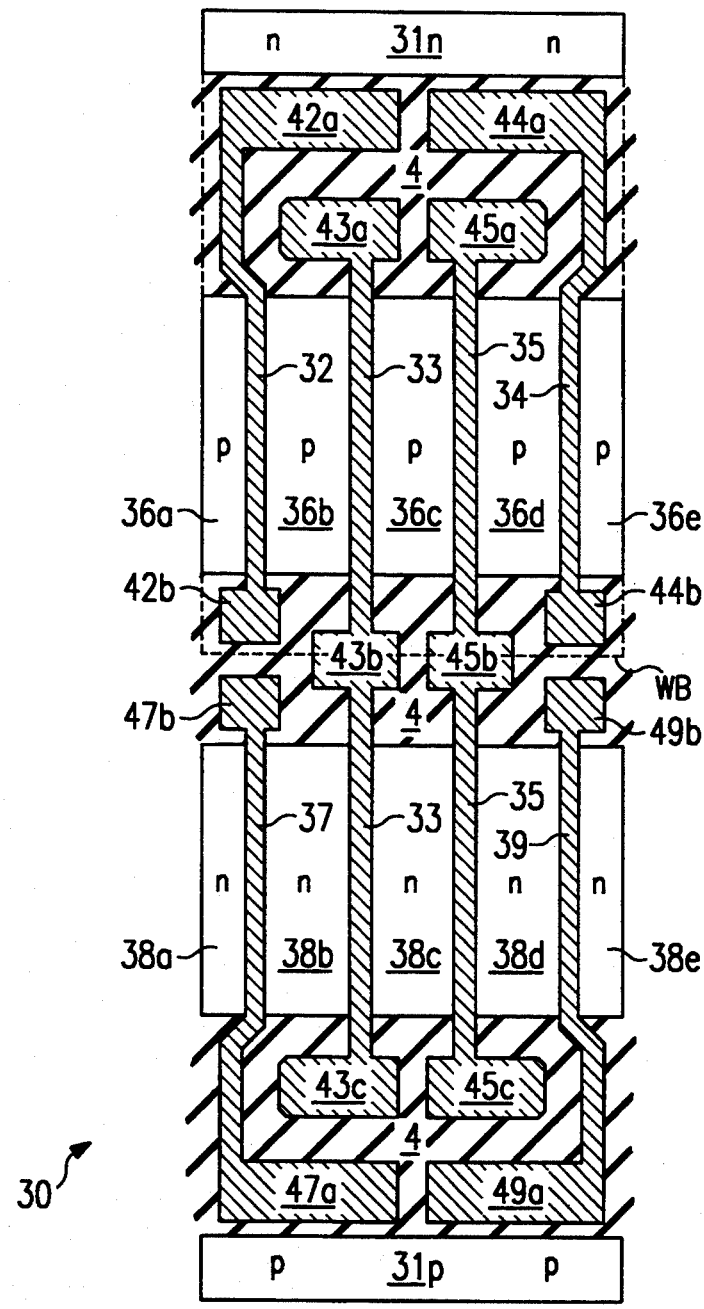
FIG. 3 is a plan view of the base cell layout according to the preferred embodiment of the invention.

Referring now to FIG. 3, gate array cell 30 according to the preferred embodiment of the invention will now be described in detail. As in the case of the conventional base gate array cells 2, 20 described hereinabove, a gate array integrated circuit utilizing cell 30 according to the preferred embodiment of the invention will have many cells 30, for example from two thousand to over five hundred thousand cells 30, arranged in a regular pattern over its surface.

Cell 30 as shown in FIG. 3 is illustrated at a point in time in its manufacture prior to the formation of metallization and interconnection layers thereover, but where the transistor elements are defined. Cell 30 is of the CMOS type, and as such includes the capability of forming both p-channel and n-channel MOS transistors within its boundaries. Accordingly, cell 30 includes polysilicon electrodes 32, 34 crossing over an active area between field oxide structures 4 to form PMOS transistors, and includes electrodes 37, 39 crossing over another active area between field oxide structures 4 to form NMOS transistors. Electrodes 33, 35 extend over both active areas to form complementary PMOS and NMOS transistors with a common gate. In cell 30 according to this embodiment of the invention, electrodes 33, 35 are located between electrodes 32, 34, 37, 39.

According to this example, where a single-well process is used, the active region containing p-type diffused regions 36 is at the surface of an n-type well, having boundary WB as shown in FIG. 3. For purposes of this description, the term "diffused region" is intended to refer to a doped semiconductor region or active region, which may be formed by way of conventional diffusion, ion implantation, or other conventional techniques for doping semiconductor material. In this example, p-type diffused regions 36a through 36e are preferably formed in conventional self-aligned manner relative to electrodes 32, 33, 34, 35. In cell 30, p-type diffused regions 36a, 36b are separated by a channel region underlying electrode 32, p-type diffused regions 36b, 36c are separated by a channel region underlying electrode 33, p-type' diffused regions 36c, 36d are separated by a channel region underlying electrode 35, and p-type diffused regions 36d, 36e are separated by a channel region underlying electrode 34. As such, each of electrodes 32, 33, 34, 35 are available to serve as a gate electrode for a p-channel transistor.

Similarly, n-channel transistors are also defined in cell 30 by electrodes 33, 35, 37, 39 overlying an active region between field oxide structures 4; in this example, where a single well process is used, the active region in which n-channel transistors are formed is a p-type surface of the underlying substrate. Of course, other conventional CMOS well designs may also be used, such as a twin-well process or a process in which the p-channel transistors are formed in the substrate and where the n-channel transistors are formed in a p-type well. N-type diffused regions 38a through 38e are preferably formed in conventional self-aligned manner relative to electrodes 33, 35, 37, 39. N-type diffused regions 38a, 38b are separated by a channel region underlying electrode 37, n-type diffused regions 38b, 38c are separated by a channel region underlying electrode 33, n-type diffused regions 38c, 38d are separated by a channel region underlying electrode 35, and n-type diffused regions 38d, 38e are separated by a channel region underlying electrode 39. As such, each of electrodes 33, 35, 37, 39 are available to serve as a gate electrode for a n-channel transistor.

As a result of the configuration of cell 30 according to the preferred embodiment of the invention, four p-channel transistors and four n-channel transistors are available for use in a digital circuit realization. As evident from the foregoing description, each of inner electrodes 33, 35 serve as potential gate electrodes for both a p-channel and an n-channel transistor simultaneously, as each of inner electrodes 33, 35 extends over field oxide structure between p-type diffused regions 36 and n-type diffused regions 38. Electrode 33 has enlarged portions, or flags 43a and 43c overlying field oxide 4 at its two ends, and flag 43b overlying field oxide 4 at its center, to which connection may be made by overlying metallization; electrode 35 is similarly constructed, with flags 45a, 45c at its two ends overlying field oxide 4, and with flag 45b at its center also overlying field oxide 4. As such, cell 30 includes two CMOS transistor pairs with common gates.

In cell 30, however, outer electrodes 32, 34 for the p-channel transistors are not connected, at the polysilicon level, to outer electrodes 37, 39 for the n-channel transistors. Each outer electrode 32, 34 for the p-channel transistors has a pair of flags 42a/42b, 44a/44b, respectively, overlying field oxide 4 on either side of the p-channel active regions, to facilitate connection thereto; similarly, n-channel transistor outer electrodes 37, 39 each have a pair of flags 47a/47b, 49a/49b overlying field oxide 4 on either side of the n-channel active regions. Outer electrode flags 42a, 44a, 47a, 49a are each disposed further from their respective active regions than are flags 43a, 45a, 43c, 45c, so that separate connection thereto may readily be made.

Diffused regions 31p, 31n are disposed outside of field oxide 4, with p-type diffused region 31p near n-type diffused regions 38 and n-type diffused region 31n near p-type diffused regions 36. Diffused regions 31p, 31n thus allow connection of power bus lines to the well underlying its adjacent transistors (or underlying substrate, as the case may be). As such, diffused region 31n will generally be connected to a metal conductor (not shown) biased to $V_{dd}$, and diffused region 31p will be connected to a metal conductor (not shown) that is biased to ground or $V_{ss}$. As in the case of cell 20, the next adjacent cell to cell 30 in the vertical direction preferably has its orientation of n-channel to p-channel transistors reversed, so that adjacent cells, in the vertical direction, can share diffused regions 31p, 31n.

According to the present invention, and if available in the process technology used to implement cell 30, it is preferred that diffused regions 31p, 31n be subjected the well-known self-aligned silicidation ("salicide") process. According to the salicide process, a refractory metal such as titanium or tungsten is deposited over the integrated circuit after formation of the gate electrodes and source-drain regions, and is then heated so that the metal reacts to form a metal silicide with the silicon portions of the wafer with which it is in contact. The unreacted metal is then removed, leaving the active regions and gate levels clad with the metal silicide, greatly reducing the series resistance of the structures. Cladding of diffused regions 31p, 31n with a metal silicide allows their use as power distribution in the gate array including cells 30, as the series resistance of diffused regions 31p, 31n will thus be on the order of 5 to 50 ohms per square. By using salicided diffused regions 31p, 31n for power distribution, the number of metallization connections required in implementing a digital function is greatly reduced, which in turn provides additional area that is free of metallization. This allows more complex circuits to be realized in cells 30 with a given number of metallization levels.

As a result of the configuration of cell 30 described above and shown in FIG. 3, the isolation technique between adjacent cells 30 is cutoff isolation, when outer electrodes 32, 34, 37, 39 are biased in such fashion. As such, regions 36a, 38a are in contact with regions of an adjacent cell (on the left of cell 30 of FIG. 3) corresponding to regions 36e, 38e respectively; regions 36e, 38e are in contact with regions of an adjacent cell (on the right of cell 30) corresponding to regions 36a, 38a, respectively.

Figure 1A:
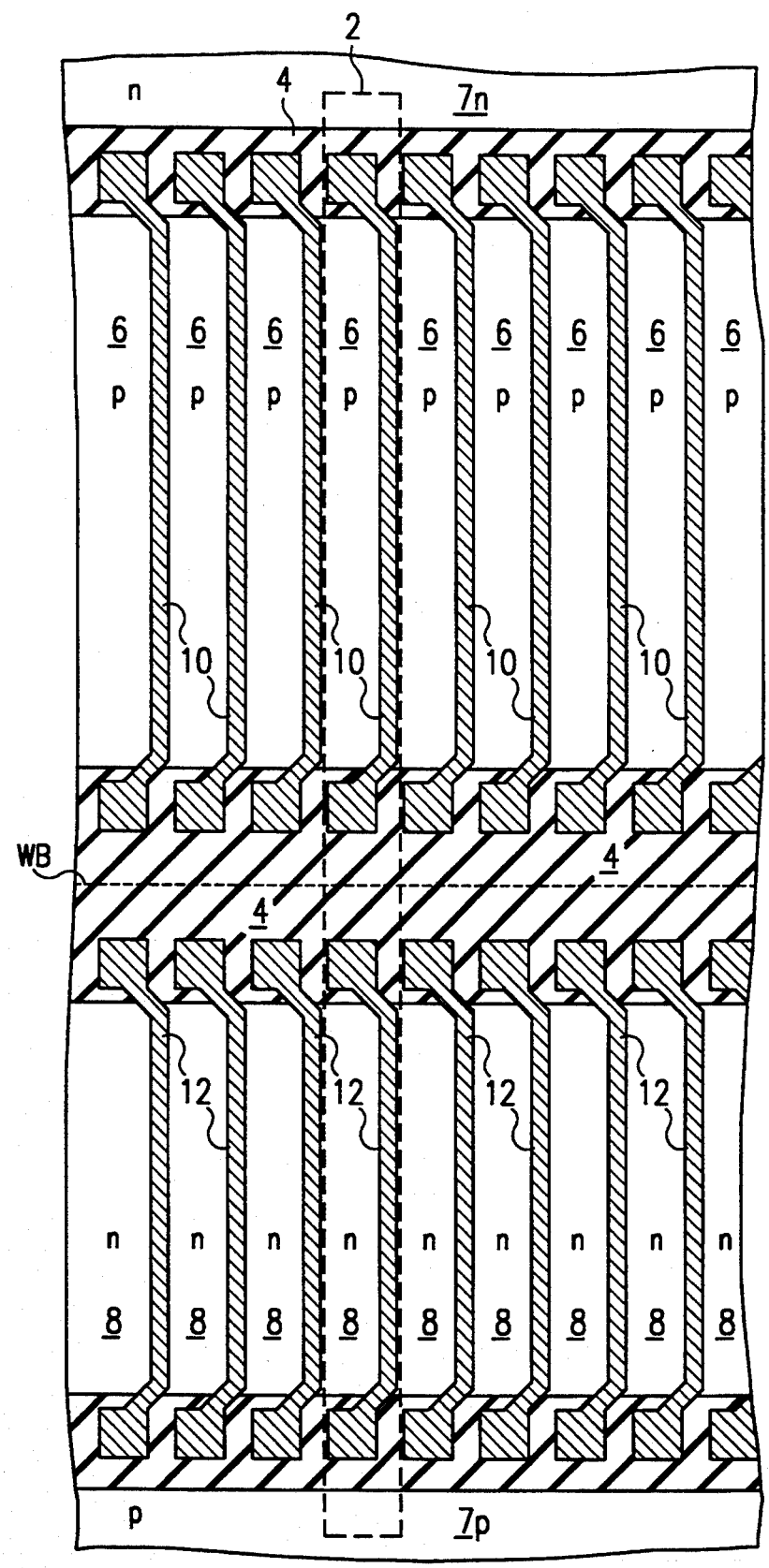
FIGS. 1a and 1b are plan views of a conventional base cell layout.
Figure 1B:
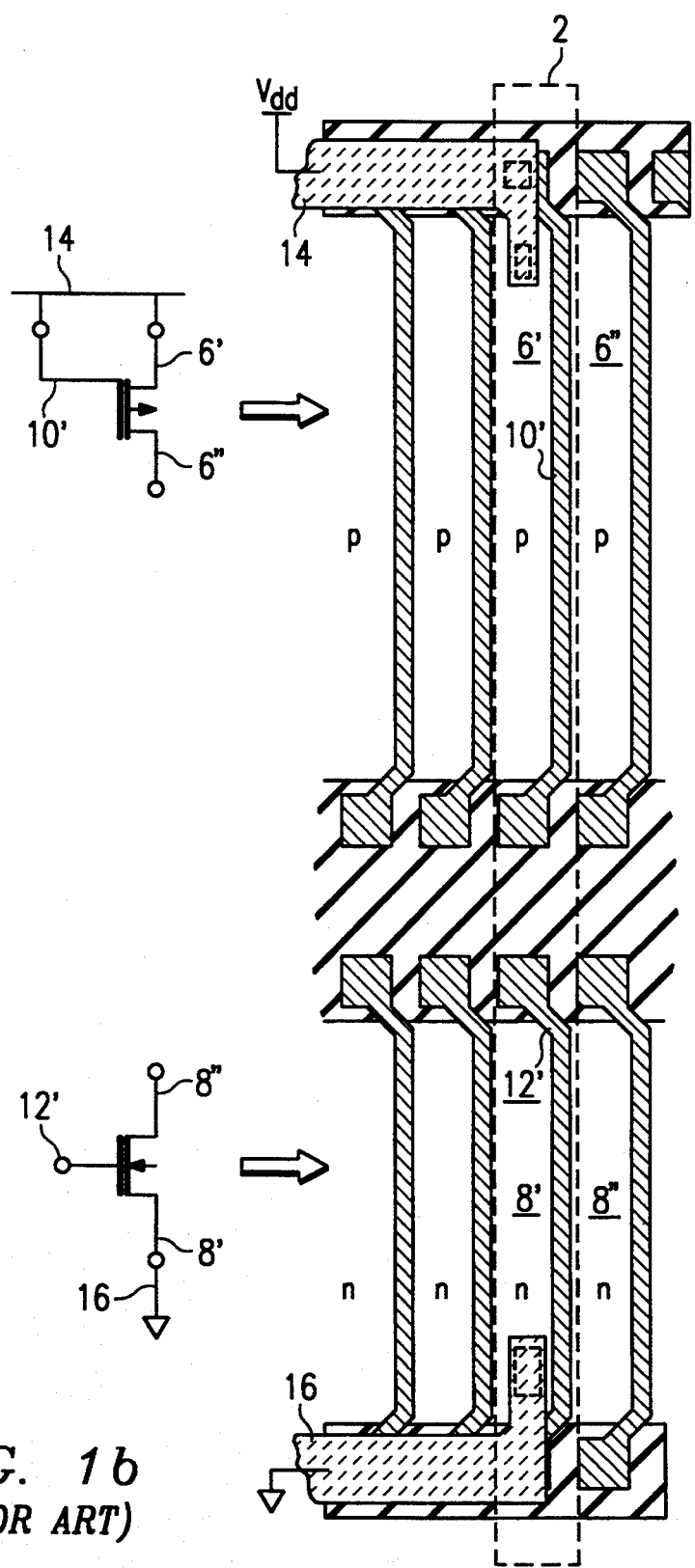

Cell 30 according to the present invention provides many advantages relative to conventional base cells, including those discussed hereinabove relative to FIGS. 1a, 1b and 2. Firstly, in most CMOS processes, the required spacing with which contacts to polysilicon must be separated from neighboring unrelated (i.e., electrically isolated) polysilicon is generally less than the minimum field oxide width. As such, cutoff isolation techniques generally require less silicon area to implement than does oxide isolation, considering the design rules noted above and also considering that the source/drain region on the outer edges of each cell are shared. Cell 30 thus takes advantage of the reduced isolation area needs, by providing cutoff isolation transistors between it and adjacent cells. However, as evident from FIG. 1, cutoff isolation base cells heretofore have not included common gate electrodes for p-channel and n-channel transistors, since cutoff isolation for both transistor types is impossible to achieve if the gate electrode is in common; by analogy, one transistor is always "on" in a CMOS inverter with common gate.

However, cell 30 obtains the benefit of reduced silicon area provided by cutoff isolation while still obtaining the benefit of oxide isolation base cells of efficient realization of transmission gate style latches (i.e., complementary transistors with common gate electrodes). This additional benefit is provided by inner electrodes 33, 35, each of which provide the capability of common gate p-channel and n-channel transistors.

Cell 30 according to the preferred embodiment of the invention, utilizing both cutoff transistors and complementary common gate transistors as noted above, results in significant improvements in the usability of cells 30 in a gate array, and thus the efficiency of implementing conventional digital circuit functions. Relative to the oxide isolation technique shown in FIG. 2, the width of cell 30, implementing the two cutoff transistors (i.e., outer electrodes 32, 34, 37, 39) is the same (if not reduced); the height of cell 30 is increased by one or two wiring tracks, in order to accommodate the additional set of flags. Since transistors of both types are available, however, cell 30 is readily adaptable to implement both stacked inverter latch types and also transmission gate latch types, and as a result can implement more functions within less silicon area than the conventional cell designs discussed above.

Figure 2:
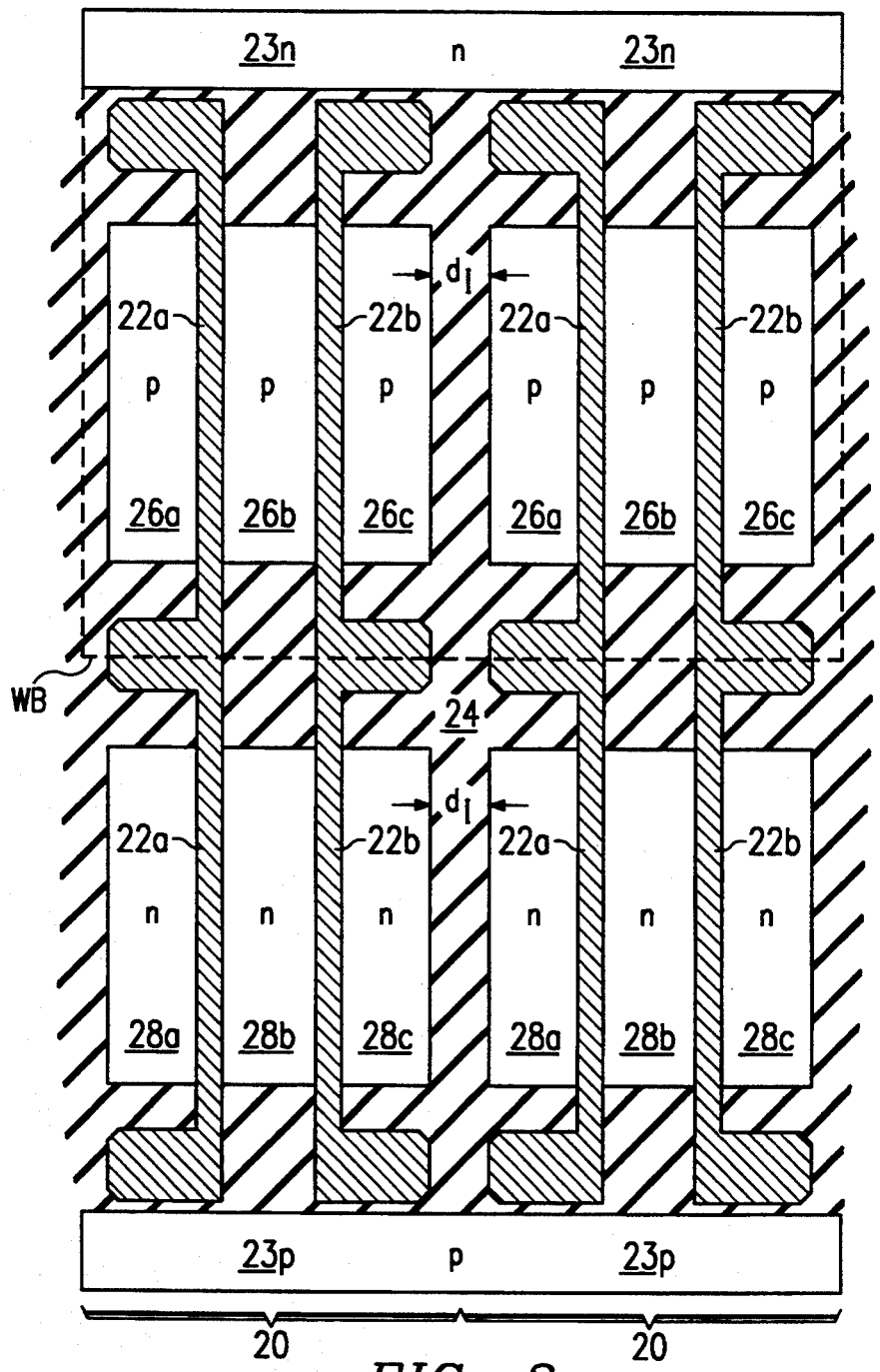
FIG. 2 is a plan view of another conventional base cell layout.
Figure 4A:
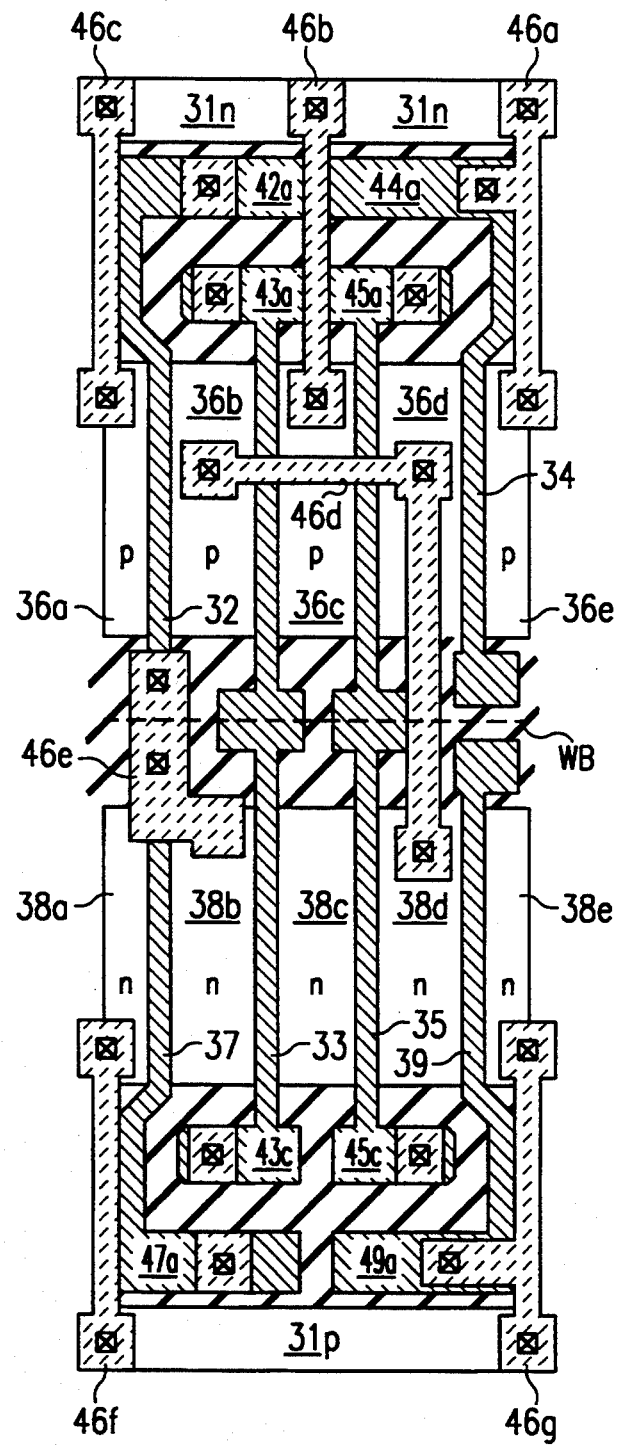
FIG. 4a is a plan view of the base cell layout of FIG. 3 as used to realize a three-input logic function.
Figure 4B:
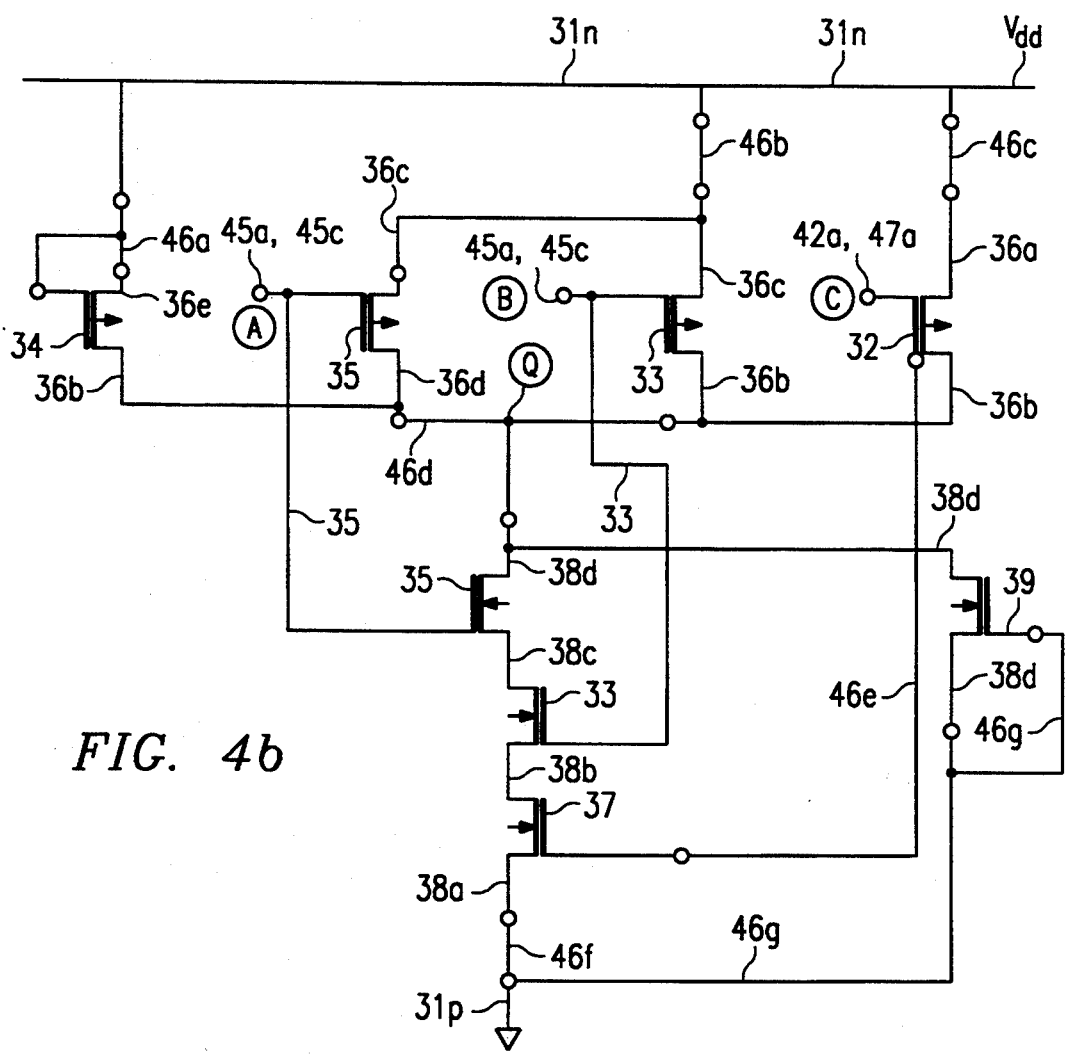

For example, it is contemplated that an individual cell 30 may implement up to a three-input NAND function, or up to two two-input NAND circuit equivalents, in substantially the same area as a single cell of the conventional oxide isolation type (FIG. 2). Referring now to FIGS. 4a and 4b, the realization of such a three-input NAND in a single one of cell 30 will be described in detail. FIG. 4a illustrates cell 30 as described above together with overlying metallization 46a through 46g; the schematic diagram of FIG. 4b illustrates the electrical connection of the cell 30 elements to realize this function. As shown in FIGS. 4a and 4b, the NAND function is realized with single level metallization. Additional signal connections (not shown) to the nodes of the NAND function may be made in the same metal level, or in additional overlying levels of metallization making contact to the metallization illustrated in FIG. 4a in the conventional manner.

In the example of FIGS. 4a and 4b, diffused regions 31p, 31n, as well as each of the silicon surface elements, are clad with a metal silicide film. As such, diffused region 31n carries the $V_{dd}$ bias to cell 30, and diffused region 31p carries ground to cell 30. Metal conductor 46a connects diffused region 31n to flag 44a of electrode 34, and to p-type diffused region 36e, by way of contacts through a dielectric therebetween as is conventional in the art. Metal conductor 46b connects diffused region 31n to p-type diffused region 36c, and metal conductor 46c similarly connects diffused region 31n to p-type diffused region 36a. On the n-channel side of cell 30, metal conductor 46f connects the ground bias at diffused region 31p to n-type diffused region 38a, and metal conductor 46g connects polysilicon conductor flag 49a of electrode 39 and n-type diffused region 38e to the ground bias of p-type diffused region 31p. The connection of each of the outlying diffused regions 36a, 36e, 38a, 38e to $V_{dd}$ or to ground, as the case may be, conforms to a preferred macro design convention that facilitates utilization of neighboring cells.

As a result of metal conductors 46a, 46b, 46f, 46g, isolation of the NAND function implemented in cell 30 from neighboring cells sharing p-type diffused regions 36a, 36e and n-type diffused regions 38a, 38e is effected. The transistors defined by electrodes 34 and 39 are held in the off-state by their bias and the bias of their adjacent diffused regions 36e, 38e, to $V_{dd}$ and ground, respectively; the respective diffused regions 36d, 38d are thus allowed to be driven to any voltage without leakage to neighboring cells. Diffused regions 36a, 38a are each used as the sources of their respective transistors defined by electrodes 32, 37, respectively, and as such are biased to $V_{dd}$ and ground, respectively; transistors in an adjacent cell will thus not affect or be affected by the operation of cell 30.

The NAND function in this case is defined by the remaining interconnections illustrated physically in FIG. 4a and schematically in FIG. 4b. Metal conductor 46b, as noted above, provides bias of $V_{dd}$ to p-type diffused region 36c, which serves as the source region to two p-channel transistors defined by the top portion of electrodes 33 and 35. Metal conductor 46d interconnects p-type diffused region 36b, p-type diffused region 36d and n-type diffused region 38d, and serves as the output node Q (see FIG. 4b) to which a metal connection (not shown) may be made, either in the same metal level as conductors 46 or in an overlying additional metal level, to route the result of the NAND function to another cell in the gate array circuit. Metal conductor 46e connects electrode 32 to electrode 37 to complete the circuit.

Accordingly, the three inputs to the NAND function realized in cell 30 of FIG. 4a are the A input received at either or both of flags 45a, 45c and thus controlling the complementary transistors having electrode 35 as their gate, the B input received at either or both of flags 43a, 43c and thus controlling the complementary transistors having electrode 33 as their gate, and the C input received at either or both of flags 42a, 47a and thus controlling the complementary transistors having electrodes 32, 37, respectively (interconnected by metal conductor 46e) as their gate. The three p-channel transistors defined by electrodes 32, 33, 35 are thus connected in parallel with their drains connected to the output Q via p-type diffused regions 36b, 36d, and the three n-channel transistors defined by electrodes 35, 33, 37 are connected in series between ground and n-type diffused region 38d.

As a result, a single cell 30 according to the preferred embodiment of the invention readily implements a three-input NAND function; one of ordinary skill in the art would recognize, of course, that a three-input NOR function would be implementable in cell 30 in a complementary manner relative to the NAND of FIGS. 4a and 4b. Cell 30 is thus able to implement a more complex function within its boundaries, relative to conventional cells as described hereinabove. For an example of a comparison, given the same minimum wiring track width (e.g., 2.5 microns), cell 30 may be implemented in silicon area of 30 microns (height) by 10 microns (width), or 300 microns$^2$. However, since a single cell 30 can implement a three-input NAND, and considering a wide range of circuit macros, it has been observed that the average silicon area required to implement a two-input NAND equivalent function (which is the figure of merit for this comparison) in cell 30 according to the preferred embodiment of the invention is approximately 200 microns$^2$/gate. Indeed, a two-input NAND can be realized in cell 30 either in double-buffered fashion (i.e., with two transistors in parallel for each input in each leg), or without double buffering by merely using the cutoff transistors defined by the outer electrodes as isolation rather than switching devices.

In contrast, cell 2 according to the cutoff isolation technique described above requires 45 microns (height) by 2.5 microns (width), and requires three cells 2 to implement an actual two-input NAND gate. Considering a large range of circuit macros, a two input NAND equivalent function requires two-and-one-half cells 2, resulting in a figure of merit for cell 2 of 280 microns$^2$/gate. A single cell 20 according to the oxide isolation technique described above is sufficient to implement an actual two-input NAND (and also the circuit equivalent); the size of cell 20 is 25 microns (height) by 10 microns (width), resulting in a 250 microns$^2$/gate figure of merit. It is therefore evident that cell 30 according to the present invention is significantly more efficient in implementation of digital functions than either of the conventional cell types, among its other advantages.

Furthermore, relative to the cutoff isolation cell (FIGS. 1a, 1b), the size of the transistors in cell 30 are reduced, thus reducing the active power dissipation and less input load, while still allowing for push-pull output drive. Accordingly, the flexibility, utilization, and efficiency of cell 30 is much improved over either of the conventional types discussed hereinabove.

Figure 5B:
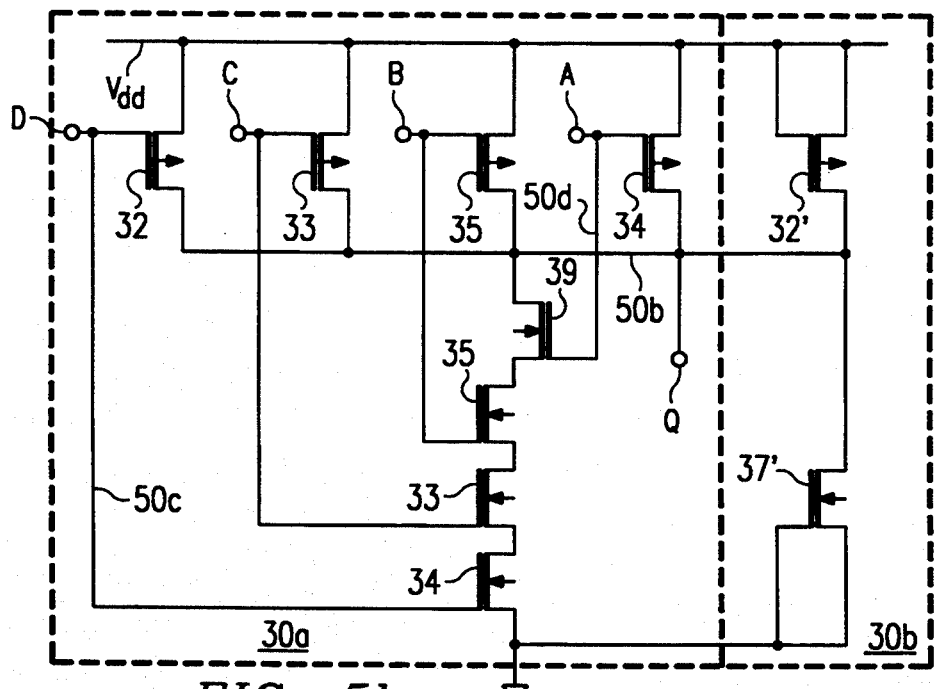
Figure 5A:
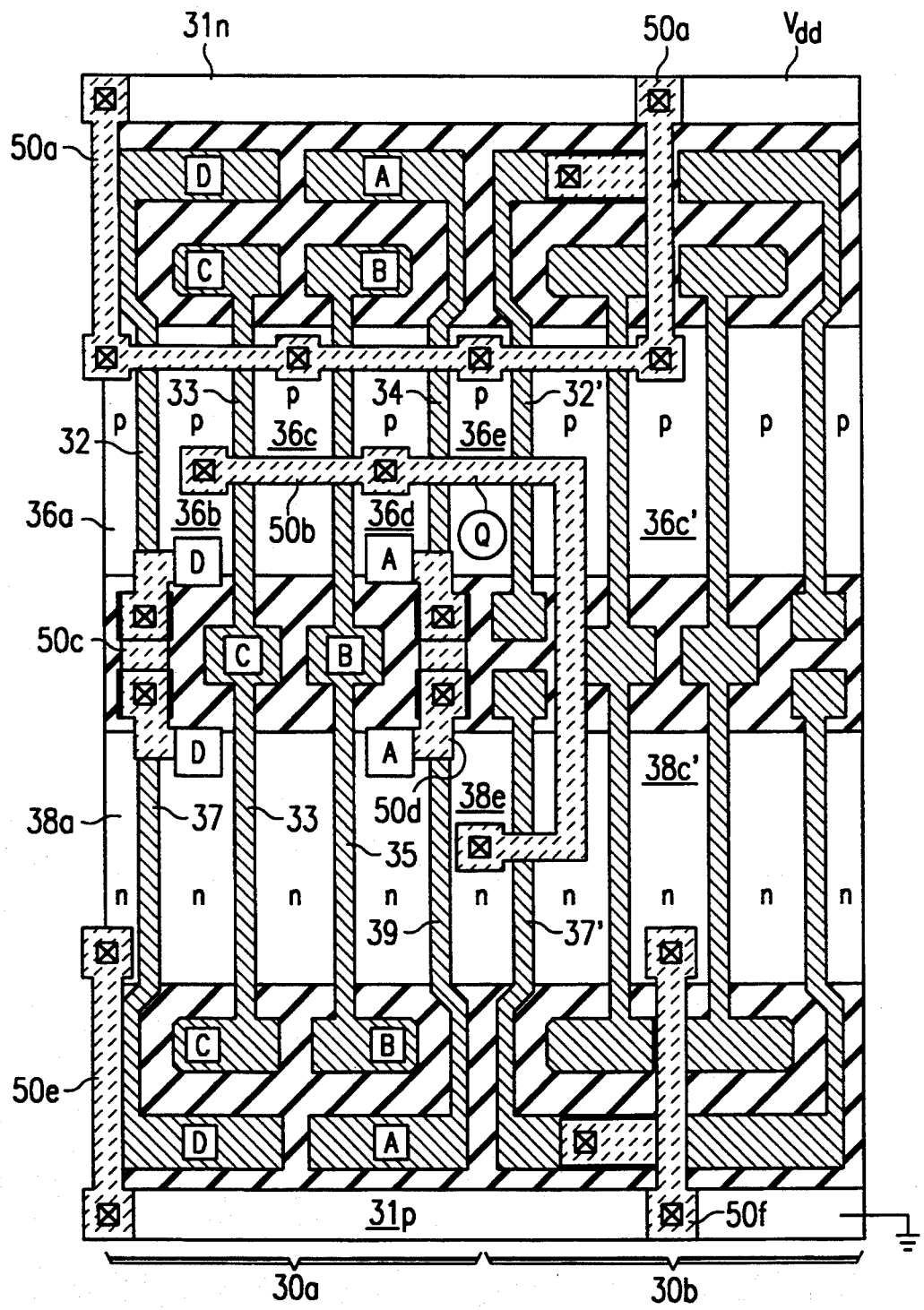
FIG. 5a is a plan view of the base cell layout of FIG. 3 as used to realize a four-input logic function.

Cell 30 according to the preferred embodiment of the invention, while adequate for implementing a relatively complex small scale integration function such as a three-input NAND function as described above, may of course be utilized in combination with a neighboring cell 30 similarly constructed in realizing still more complex functions. In particular, only a portion of such a neighboring cell 30 may be necessary for some functions, allowing the remainder of the neighboring cell 30 to be used for a different function. Referring now to FIGS. 5a and 5b, such an implementation is illustrated for the example of a four-input NAND function implemented in one-and-one-half cells 30.

In the example of FIGS. 5a, cell 30a and one-half of cell 30b are used to implement the four-input NAND function schematically illustrated in FIG. 5b. In this example, the outer electrodes 32', 37' of cell 30b as isolation devices for the NAND of cell 30a. This realization is accomplished by first level metal conductor 50a, biased by $V_{dd}$, which connects diffused region 31n (common to cells 30a, 30b) to alternating p-type diffused regions 36a, 36c, 36e in cell 30a, to center p-type diffused region 36c in cell 30b, and also to electrode 32'. The $V_{dd}$ bias of p-type diffused region 36c' in cell 30b allows for the remainder of cell 30b to be used for a separate function that is isolated from the NAND function. Similarly, on the n-channel side, common diffused region 31p is biased to ground, is connected via metal conductor 50e to n-type diffused region 38a of cell 30a, and is connected via metal conductor 50f to center n-type diffused region 38c' and electrode 37' in cell 30b.

The active portion of the NAND function is implemented by metal conductor 50b which is connected to alternating p-type diffused regions 36b, 36d in cell 30a, and to n-type diffused region 38e of cell 30a (which is shared by cell 30b); metal conductor 50b thus serves as the Q output of the NAND function, and may be contacted by a metal conductor (not shown) for routing of the output to elsewhere in the gate array integrated circuit. Gate connection between electrodes 32 and 37 is made by metal conductor 50c, and gate connection between electrodes 34 and 39 is made by metal conductor 50d, completing the circuit. Connection of the four NAND inputs A, B, C, D may be made to the flag portions of their respective electrodes 32 (and 37), 33, 35, 34 (and 39) by way of metal connections (not shown).

Similarly as in the case of the three-input NAND function described hereinabove, cell 30 according to the preferred embodiment of the invention allows for efficient implementation of relatively complex functions. Multiple adjacent cells 30 may be used in a single function to great advantage, as shown in the example of FIGS. 5a and 5b, especially by utilizing the outer electrode transistors for purposes of isolation, which allows the use of only that portion of a cell 30 in a given function. Furthermore, the transistors realized in cell 30 according to the present invention are reduced in width from those in conventional cutoff isolation cells, thus reducing the input loading and also the active power dissipation of the circuits, but without requiring the silicon area necessary for implementing oxide-isolated cells.

Also as noted above, the provision of electrodes of both common-connection (e.g., inner electrodes 33, 35) and separate connection (e.g., outer electrodes 32, 34, 37, 39) enables the implementation of latches according to either the stacked inverter type or the transmission gate type with equivalent efficiency. Indeed, latches such as D-type flip-flops have been realized using the cell according to the present invention which include both stacked inverters and transmission gates, and as such are quite efficient. Such a D-type flip-flop can be realized in as little as four cells, arranged in a two-by-two configuration.

While the invention has been described herein relative to its preferred embodiment, it is of course contemplated that modifications of, and alternatives to, this embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. An integrated circuit, comprising a plurality of repetitively placed cells arranged in an array at a semiconducting surface of a body, each of said cells comprising:

a first active region of said semiconducting surface, having a first conductivity type and extending to first and second outer edge of the cell;

a second active region of said semiconducting surface, having a second conductivity type and extending to the first and second outer edges of the cell;

a first field oxide structure disposed at said semiconducting surface between said first and second active regions;

first and second outer electrodes extending across said first active region in a first direction, each of said first and second outer electrodes spaced away from the first and second outer edges, respectively, of the cell;

a first diffused region of said second conductivity type formed in said first active region and disposed between the first outer edge of the cell and said first outer electrode, so as to be in contact with a diffused region of said second conductivity type of an adjacent cell;

a second diffused region of said second conductivity type formed in said first active region and disposed between the second outer edge of the cell and said second outer electrode, so as to be in contact with a diffused region of said second conductivity type of an adjacent cell;

third and fourth outer electrodes extending across said second active region in said first direction, each of said third and fourth outer electrodes spaced away from first and second outer edges of the cell, respectively;

a third diffused region of said first conductivity type formed in said second active region between the first outer edge of the cell and said third outer electrode, so as to be in contact with a diffused region of said first conductivity type of an adjacent cell;

a fourth diffused region of said first conductivity type formed in said second active region between the second outer edge of the cell and said fourth outer electrode, so as to be in contact with a diffused region of said first conductivity type of an adjacent cell; and a first inner electrode extending across both said first and second active regions in said first direction, and disposed between said first and second outer electrodes in said first active region, and disposed between said third and fourth outer electrodes in said second active region.

2. The integrated circuit of claim 1, further comprising:

a second inner electrode extending across both said first and second active regions in said first direction, and disposed between said first and second outer electrodes in said first active region, and disposed between said third and fourth outer electrodes in said second active region.

3. The integrated circuit of claim 1, wherein said first, second, third and fourth outer electrodes each comprise first and second enlarged portions at each of its ends, each of said first enlarged portions overlying said first field oxide structure;

and further comprising:
a second field oxide structure disposed adjacent said first active region; and
a third field oxide structure disposed adjacent said second active region;
wherein the second enlarged portions of said first and second outer electrodes overly said second field oxide structure;
and wherein the second enlarged portions of said third and fourth outer electrodes overly said third field oxide structure.

4. The integrated circuit of claim 3, wherein each of said first, second, third and fourth outer electrodes comprise polysilicon.

5. The integrated circuit of claim 1, further comprising:
a second field oxide structure disposed near said first active region; and
a third field oxide structure disposed near said second active region;
wherein said first inner electrode comprises first and second enlarged portions at its ends, said first enlarged portion overlying said second field oxide structure, and said second enlarged portion overlying said third field oxide structure.

6. The integrated circuit of claim 5, wherein said first inner electrode further comprises a central enlarged portion overlying said first field oxide structure.

7. The integrated circuit of claim 5,
wherein said first and second outer electrodes each comprise a first enlarged portion at a first one of its ends overlying said second field oxide structure.

8. The integrated circuit of claim 7, wherein said first enlarged portion of said first inner electrode is disposed nearer said first active region than the first enlarged portions of said first and second outer electrodes.

9. The integrated circuit of claim 1, further comprising:
a first diffused conductor extending in a second direction and disposed at said semiconducting surface; and
a second diffused conductor extending in said second direction and disposed at said semiconducting surface;
wherein said first and second active regions are disposed between said first and second diffused conductors.

10. The integrated circuit of claim 9, wherein said first and second diffused conductors of adjacent ones of said cells are connected together.

11. An integrated circuit, comprising a plurality of repetitively placed cells arranged in an array at a semiconducting surface of a body at which complementary MOS circuits are realized, each of said cells comprising:
a plurality of p-type diffused regions disposed at said semiconducting surface;

a first outer electrode extending in a first direction between first and second ones of said plurality of p-type diffused regions, said first one of said plurality of p-type diffused regions extending to a first edge of said cell so as to be in physical contact with a p-type diffused region in an adjacent cell;
a second outer electrode extending in said first direction between third and fourth ones of said plurality of p-type diffused regions, said fourth one of said plurality of p-type diffused regions extending to a second edge of said cell;
a plurality of n-type diffused regions disposed at said semiconducting surface;
a third outer electrode extending in said first direction between first and second ones of said plurality of n-type diffused regions, said first one of said plurality of n-type diffused regions extending to the first edge of said cell so as to be in physical contact with an n-type diffused region in an adjacent cell;
a fourth outer electrode extending in said first direction between third and fourth ones of said plurality of n-type diffused regions, said fourth one of said plurality of n-type diffused regions extending to the second edge of said cell;
an inner field oxide structure disposed at said semiconducting surface between said pluralities of p-type and n-type diffused regions;
a first inner electrode extending in said first direction between said first and second outer electrodes, and between said third and fourth outer electrodes, said first inner electrode serving as a gate between a pair of said plurality of p-type diffused regions and as a gate between a pair of said plurality of n-type diffused regions.

12. The integrated circuit of claim 11, further comprising:
a second inner electrode extending in said first direction between said first and second outer electrodes, and between said third and fourth outer electrodes, said second inner electrode serving as a gate between a pair of said plurality of p-type diffused regions and as a gate between a pair of said plurality of n-type diffused regions.

13. The integrated circuit of claim 11, further comprising:
an n-type doped conductor extending in a second direction and disposed at said semiconducting surface at a third edge of said cell near said plurality of p-type diffused regions; and
a p-type doped conductor extending in said second direction and disposed at a fourth edge of said cell near said plurality of n-type diffused regions.

14. The integrated circuit of claim 11, wherein said first, second, third and fourth outer electrodes comprise polysilicon.

15. The integrated circuit of claim 14, wherein said first inner electrode comprises polysilicon.

16. The integrated circuit of claim 15, further comprising:
a plurality of metal conductors, each in contact with a selected one of said outer electrodes and a selected one of said diffused regions.

17. The integrated circuit of claim 11, further comprising:
first and second outer field oxide structures disposed at said semiconducting surface at opposing ends of each of said p-type diffused regions and n-type diffused regions, respectively, from said inner field oxide structure;

wherein each of said first and second outer electrodes comprise an enlarged pad at an end thereof which overlies said first outer field oxide structure;

wherein each of said third and fourth outer electrodes comprise an enlarged pad at an end thereof which overlies said second outer field oxide structure.

18. The integrated circuit of claim 17, wherein said first inner electrode comprises first and second enlarged pads at first and second ends thereof overlying said first and second outer field oxide structures, respectively;

wherein said first enlarged pad of said first inner electrode is disposed nearer said plurality of p-type diffused regions than said enlarged pads of said first and second outer electrodes;

and wherein said second enlarged pad of said first inner electrode is disposed nearer said plurality of n-type diffused regions than said enlarged pads of said third and fourth outer electrodes.

* * * * *